(12) United States Patent
Tsukada

(10) Patent No.: US 7,362,636 B2
(45) Date of Patent: Apr. 22, 2008

(54) SEMICONDUCTOR MEMORY DEVICE

(75) Inventor: Shuichi Tsukada, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 36 days.

(21) Appl. No.: 11/516,701

(22) Filed: Sep. 7, 2006

(65) Prior Publication Data

US 2007/0053234 A1    Mar. 8, 2007

(30) Foreign Application Priority Data

Sep. 7, 2005    (JP)    ............................. 2005-259910

(51) Int. Cl.
*G11C 7/00* (2006.01)
(52) U.S. Cl. ...................... 365/205; 365/206; 365/207
(58) Field of Classification Search ................ 365/205, 365/206, 207; 327/534, 537
See application file for complete search history.

(56) References Cited

U.S. PATENT DOCUMENTS 5,646,899 A    7/1997   Jang et al.
6,879,534 B2 *  4/2005  Perner et al. ................ 365/209
6,879,539 B2 *  4/2005  Kawasaki ............... 365/230.03

FOREIGN PATENT DOCUMENTS

JP    8-235861    9/1996

* cited by examiner

*Primary Examiner*—Son Dinh
(74) *Attorney, Agent, or Firm*—McDermott Will & Emery LLP

(57) ABSTRACT

A semiconductor memory device comprising: a sense amplifier which includes a pair of first NMOS transistors and a pair of PMOS transistors connected to a bit line pair as a complementary pair; a back bias generating circuit which generates a back bias voltage to be applied to the first NMOS transistors in a state in which a predetermined current is flowing through a second NMOS transistor having approximately the same operating characteristic as that of the first NMOS transistors, and performs a feedback control in response to a threshold voltage of the second NMOS transistor; and control means which performs control in a sensing operation of the sense amplifier such that the pair of first NMOS transistors operates previously and after a lapse of a predetermined time the pair of first PMOS transistors operates.

6 Claims, 10 Drawing Sheets

SEMICONDUCTOR MEMORY DEVICE

BACKGROUND OF THE INVENTION

1. Field of the Invention

This invention relates to a semiconductor memory device having sense amplifiers for amplifying data held in a memory cell array. Particularly, this invention relates to a semiconductor memory device which employs N channel preceding sensing method for controlling operation of the sense amplifiers.

2. Related Art

In general DRAM, a configuration is employed in which minute potential of a memory cell is read out and amplified by a sense amplifier disposed corresponding to a bit line pair as a complementary pair. FIG. 7 is a diagram showing a circuit configuration of a primary part of a conventional DRAM. In the circuit configuration of FIG. 7, a plurality of bit line pairs BLT/BLN is arranged repeatedly, and a plurality of memory cells MC each formed at an intersection of bit line BLT or BLN and a word line, a plurality of sense amplifiers each connected between the bit lines BLT and BLN and a VDL generating circuit 11 for generating an array voltage VDL are shown. Although a circuit configuration corresponding to an arbitrary bit line pair BLT/BLN will be described below, the circuit configuration is common to each bit line pair BLT/BLN.

The memory cell MC includes an NMOS transistor and a capacitor. A bit line BLT or BLN is connected to one end of the NMOS transistor and a power supply VPLT is connected to one end of the capacitor. The sense amplifier 10 is composed of a pair of NMOS transistors TN1 and TN2 and a pair of PMOS transistors TP1 and TP2. Each source of the pair of NMOS transistors TN1 and TN2 is connected to a voltage supply line SAN, and each source of the pair of PMOS transistors TP1 and TP2 is connected to a voltage supply line SAP. Each of the NMOS transistor TN1 and the PMOS transistor TP1 has a drain connected to the bit line BLT and a gate connected to the bit line BLN. Each of the NMOS transistor TN2 and the PMOS transistor TP2 has a drain connected to the bit line BLN and a gate connected to the bit line BLT. By such connection, the minute potential difference generated between the bit lines BLT and BLN corresponding to accumulated charge of the memory cell MC is amplified by the sense amplifier 10.

The VDL generating circuit 11 is a circuit which generates the array voltage VDL necessary for operation of each sense amplifier 10. The array voltage VDL is connected to the voltage supply line SAP through a PMOS transistor TP3. The PMOS transistor TP3 turns ON in response to a control signal SEP applied to its gate and is activated when the array voltage VDL is supplied to the voltage supply line SAP. And a ground potential VSS is connected to the voltage supply line SAN through an NMOS transistor TN3. The NMOS transistor TN3 turns ON in response to a control signal SEN applied to its gate and is activated when the voltage supply line SAN is connected to the ground potential VSS.

The operation of the sense amplifier 10 of FIG. 7 depends on threshold voltages Vtn of the NMOS transistors TN1 and TN2 and threshold voltages Vtp of the PMOS transistors TP1 and TP2. Generally, due to manufacturing limitation, fluctuations occur in the threshold voltages Vtn of the NMOS transistors TN1 and TN2 and the threshold voltages Vtp of the PMOS transistors TP1 and TP2 in accordance with a certain probability distribution. In the circuit configuration of the sense amplifier 10, if an unbalance of fluctuations of the threshold voltages Vtn (referred to as Vtn unbalance) of the pair of the NMOS transistors TN1 and TN2 exists, or if an unbalance of fluctuations of the threshold voltages Vtp (referred to as Vtp unbalance) of the pair of the PMOS transistors TP1 and TP2 exists, then an offset of the sense amplifier 10 occurs. The offset of the sense amplifier 10 corresponds to a limit to which the minute potential difference of the bit line pair BLT/BLN can be amplified when starting the sensing. If the offset of the sense amplifier 10 is greater than the minute potential difference of the bit line pair BLT/BLN, the sensing of the sense amplifier 10 fails. Thus, it is desirable to reduce the offset of the sense amplifier 10 sufficiently.

FIG. 8 shows characteristics of fluctuations of the threshold voltages Vtn and Vtp in a general DRAM process. In FIG. 8, characteristic Cn indicating the above-mentioned Vtn unbalance and characteristic Cp indicating the above-mentioned Vtp unbalance are compared. In the characteristic Cn, differences between the threshold voltages Vtp of the NMOS transistors N1 and N2 are measured for a large number of the sense amplifiers 10 and frequencies of the measured values are plotted. In the characteristic Cp, differences between the threshold voltages Vtp of the PMOS transistors P1 and P2 are measured for a large number of the sense amplifiers 10 and frequencies of the measured values are plotted. Both characteristics C1 and C2 have characteristics based on a normal distribution.

Meanwhile, as shown clearly in FIG. 8, the Vtp unbalance of the characteristic Cp is greater than the Vtn unbalance of the characteristic Cn. In the circuit configuration of FIG. 7, the offset of the sense amplifier 10 is determined based on an internal division between the Vtn unbalance and the Vtp unbalance. Thus, when the voltage supply lines SAN and SAP are activated at the same timing, an influence of the Vtp unbalance is dominant regarding the offset of the sense amplifier 10. On the contrary, if the voltage supply line SAN is activated earlier when starting the sensing, the offset of the sense amplifier 10 can be reduced.

Therefore, in order to take measures against the offset of the sense amplifier 10, it is effective to employ N channel preceding sensing method in which the voltage supply line SAN is activated in the first place, and after the potential difference of the bit line pair BLT/BLN is increased, the voltage supply line SAP is activated (for example, see JP H08-235861).

FIG. 9 shows an example of operation waveform in a case where the N channel preceding sensing method is employed in the sense amplifier 10. As shown in FIG. 9, in a sensing operation for a memory cell MC to be accessed, a selected word line is activated at timing T1 and its voltage rises from the ground potential VSS to a voltage VPP. Thereby, a minute potential difference corresponding to the accumulated charge of the memory cell MC is generated between the bit lines BLT and BLN. In FIG. 9, a case is shown in which voltage levels of the bit line pair BLT/BLN are maintained at a pre-charge voltage VHB at timing T1 by an equalizing circuit (not shown), and the voltage level of one bit line BLT is slightly decreased by the activation of the word line.

At timing T2, the NMOS transistor TN3 is turned on by the control signal SEN to activate the voltage supply line SAN, and the potential difference of the bit line pair BLT/BLN gradually increases by the operation of the NMOS transistors TN1 and TN2. At this time, the voltage level of the voltage supply line SAN decreases via the NMOS transistor TN3, and clamped at a voltage level lower than the pre-charge voltage VHB by the threshold voltage Vtn. As shown in the circuit configuration of FIG. 7, the NMOS transistors TN1 of the sense amplifier 10 has a source biased at the voltage level of the voltage supply line SAN and a gate biased at the voltage level of the bit line BLN. Thus, when its gate-source voltage becomes greater than the threshold voltage Vtn, the NMOS transistor TN1 turns ON, leading to a state where capacitance of the bit line BLN is connected to the voltage supply line SAN. Thereby, the voltage level of the voltage supply line SAN hardly changes rapidly and thus the above-mentioned characteristics is achieved.

At timing T3, the NMOS transistor TP3 is turned on by the control signal SEP to activate the voltage supply line SAP, and the potential difference of the bit line pair BLT/BLN further increases by the operation of the PMOS transistors TP1 and TP2 as well as the NMOS transistors TN1 and TN2. At this time, the voltage level of the voltage supply line SAP increases via the PMOS transistor TP3, and changes from the pre-charge voltage VHB to the array voltage VDL. As time elapses, the voltage level of one bit line BLN converges to the array voltage VDL gradually and the voltage level of the other bit line BLT converges to the ground potential VSS gradually.

In this manner, since the activation of the voltage supply line SAN precedes that of the voltage supply line SAP, in the case where the potential difference between the bit lines BLT and BLN is small, the amplification operation is performed using the NMOS transistors TN1 and TN2 in which fluctuations of the threshold voltages Vtn are small, so that the influence of the offset of the sense amplifier 10 can be reduced.

However, in recent years, downsizing in the DRAM process is facilitated, and from viewpoints of reliability and reduction of consumption current, the lower array voltage VDL is required. If a configuration using the lower array voltage VDL is employed, there is a great influence on the operation of the sense amplifier 10 in which the N channel preceding sensing method is employed. FIG. 10 shows an example of operation waveform in a case where the array voltage VDL is lowered in comparison with FIG. 9.

In FIG. 10, the array voltage is lowered than that in FIG. 9 and accordingly the pre-charge voltage VHB is lowered. In the sensing operation, after the voltage of the word line rises at timing T1, the voltage supply line SAN is activated at timing T2, and the bit line BLT falls to a voltage level lower than the per-charge voltage VHB by the threshold voltage Vtn. At this time, since VHB-VSS is lower than the threshold voltage Vtn, it is difficult to increase the potential difference of the bit line pair BLT/BLN by the operation of the NMOS transistors TN1 and TN2. Thus, when the voltage supply line SAP is activated at timing T3, the potential difference of the bit line pair BLT/BLN is kept small, and an influence of the Vtp unbalance becomes dominant. As a result, the offset of the sense amplifier 10 increases, and thereby the possibility that the sensing may fail increases. This causes a problem that DRAM chips which cannot be rectified by redundancy cells and the yield thereof decreases.

Further, there is a method as a measure for the above-mentioned problem in which process of the NMOS transistors of sense amplifiers is separated from processes in other areas of DRAM so as to reduce the threshold voltage Vtn. However, this method brings about a problem of an increase in active standby current flowing in a state where the sense amplifiers are activated.

BRIEF SUMMARY OF THE INVENTION

It is an object of the present invention to provide a semiconductor memory device which ensures reliable operation to amplify the potential difference of the bit line pair in sensing operation employing N channel preceding sensing method when using a lowered array voltage and prevents an increase in sensing failures caused by the offset of the sense amplifiers.

An aspect of the present invention is a semiconductor memory device comprising: a sense amplifier which includes a pair of first NMOS transistors and a pair of PMOS transistors connected to a bit line pair as a complementary pair and amplifies a potential difference of a memory cell formed on said bit line pair; a back bias generating circuit which generates a back bias voltage to be applied to said first NMOS transistors in a state in which a predetermined current is flowing through a second NMOS transistor having approximately the same operating characteristic as that of said first NMOS transistors, and performs a feedback control in response to a threshold voltage of said second NMOS transistor so as to decrease an absolute value of said back bias voltage as said threshold voltage increases and to increase said absolute value of said back bias voltage as said threshold voltage decreases; and control means which performs control in a sensing operation of said sense amplifier such that said pair of first NMOS transistors operates previously and after a lapse of a predetermined time said pair of first PMOS transistors operates.

According to the aspect of the present invention, in sensing operation of the sense amplifier, the back bias voltage applied to the pair of the first NMOS transistors is properly controlled in response to the threshold voltage. That is, by the operation of the second NMOS transistor having approximately the same operating characteristic as that of the first NMOS transistors included in the sense amplifier, the absolute value of the back bias voltage decreases when the threshold voltage increases, and the absolute value of the back bias voltage increases when the threshold voltage decreases. Thus, it is possible to control so as to cancel the fluctuation of the threshold voltage. Particularly, in the case of using the lower array voltage, it is possible to obtain an operating margin for the threshold voltage when the preceding operation of the NMOS transistor in the N channel preceding sensing method, and to properly amplify the potential difference of the bit line pair. Then, it is possible to obtain a level of the potential difference which is not affected by the unbalance of the threshold voltage when the subsequent operation of the PMOS transistor. Accordingly, a proper amplification operation can be obtained to realize the N channel preceding sensing method, ant the sensing failures caused by the offset of the sense amplifiers can be effectively prevented.

In the present invention, said back bias voltage generating circuit may include a series circuit including a first resistor connected to a drain and a gate of said second NMOS transistor and a second resistor connected to a source of said second NMOS transistor and includes a level detection circuit for detecting a voltage level of said source of said second NMOS transistor through which a predetermined current flows, and a voltage level of said back bias voltage may be controlled in response to a detected output of said level detection circuit.

In the present invention, at one end of said series circuit, said first resistor may be connected to a first reference voltage higher than said back bias voltage, and at an other end of said series circuit, said second resistor may be connected to said back bias voltage, and said level detection circuit may include a comparator having one input terminal connected to the source of said second NMOS transistor and an other input terminal connected to a second reference voltage higher than said back bias voltage and lower than said first reference voltage.

In the present invention, said back bias generating circuit may perform said feedback control so that using a voltage change ΔVtn of said threshold voltage Vtn, a resistance value R1 of said first resistor and a resistance value R2 of said second resistor, a relationship of ΔVBB=(R2/R1)·ΔVtn is satisfied.

In the present invention, said first resistor and said second resistor may be variable resistors.

In the present invention, said back bias generating circuit may comprise a ring oscillator in which oscillating operation thereof is controlled in response to a detected output of said level detection circuit and a charge pump for generating said gate voltage by charge pumping operation based on an oscillating output of said ring oscillator.

As described above, according to the present invention, the back bias voltage is generated using the second NMOS transistor having approximately the same operating characteristic as that of the NMOS transistors of the sense amplifiers and applied to the NMOS transistors of the sense amplifiers, and control is performed so as to cancel the fluctuation of the threshold voltage. By this, in a case where the N channel preceding sensing method is employed, sensing operation of the sense amplifiers is optimized to obtain higher reliability. Particularly, in a case of using the lower array voltage, a margin for the threshold voltage of the NMOS transistors is obtained to reliably amplify the potential difference of the bit line pair, and the sensing failures caused by the offset of the sense amplifier can be prevented. Further, the yield of DRAM chips can be improved without an increase in active standby current.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

Figure 1:
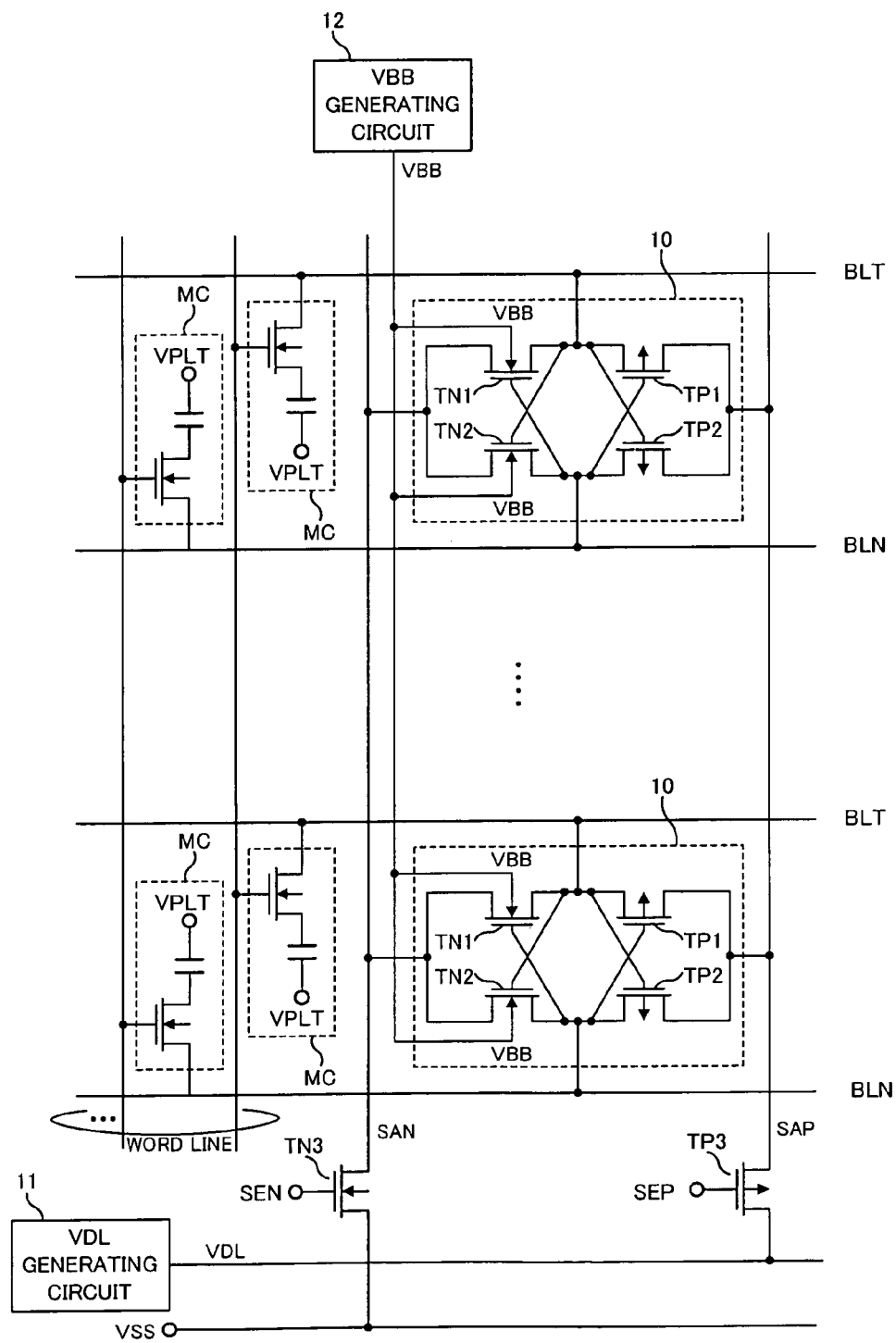
FIG. 1 is a diagram showing a primary configuration of DRAM of the embodiment.
Figure 3:
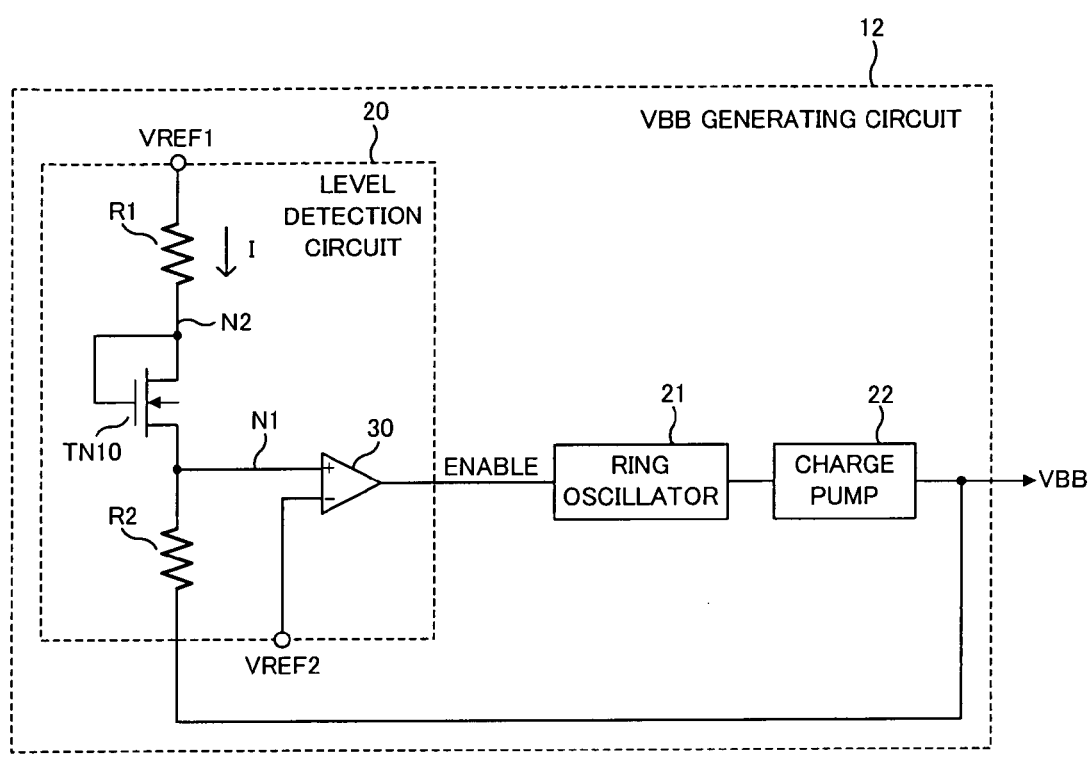
Figure 4:
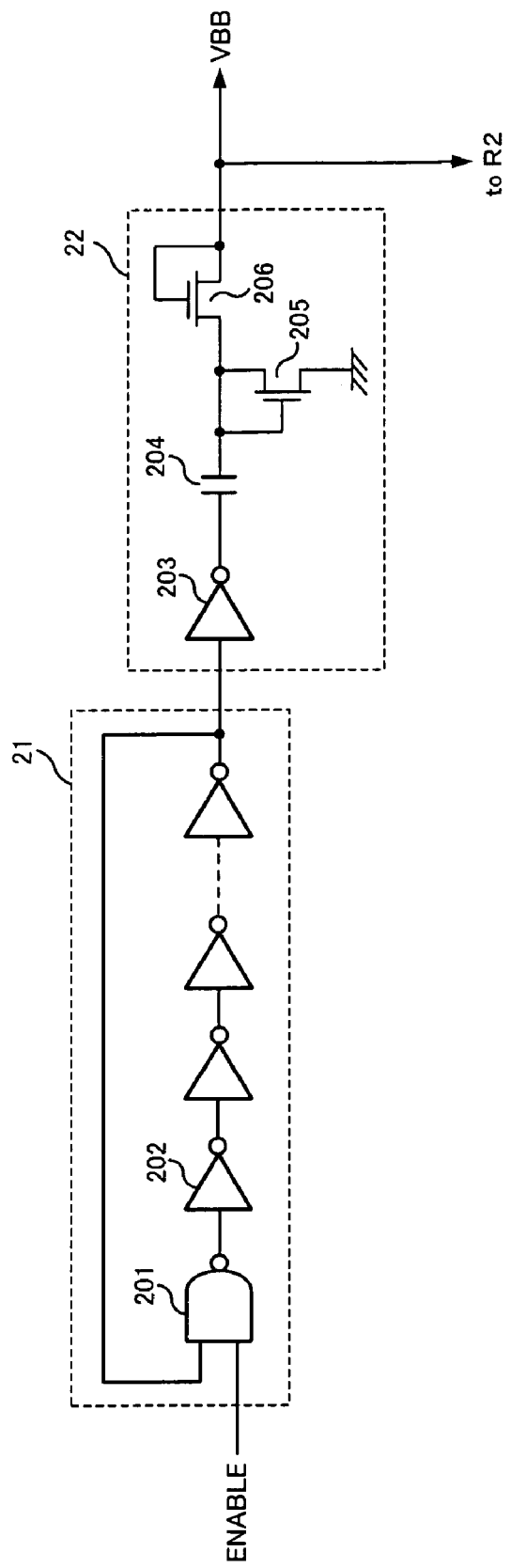
Figure 5:
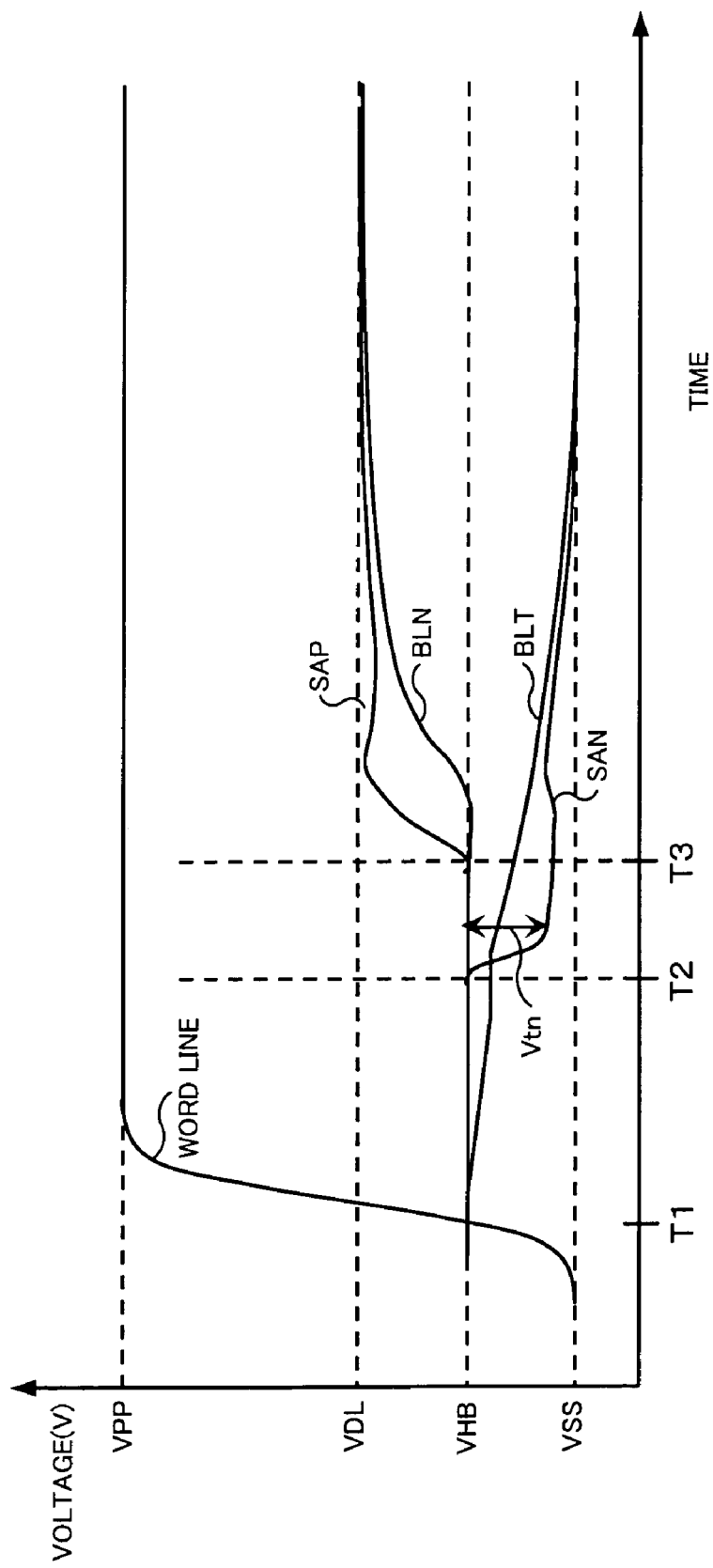
Figure 6:
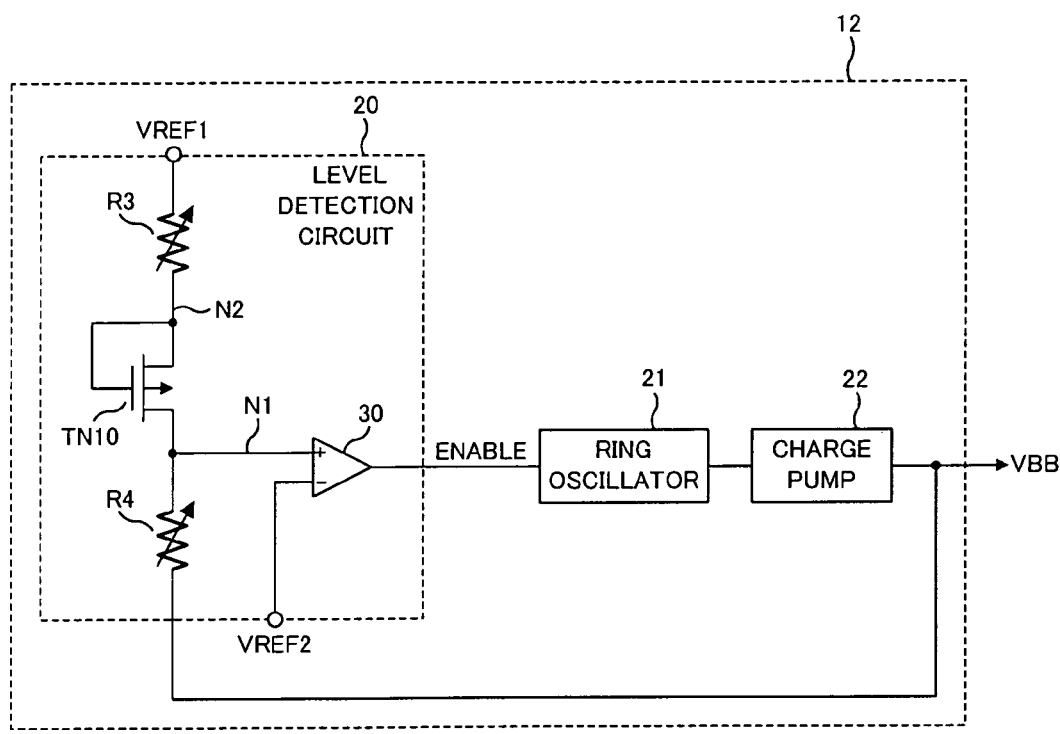
Figure 7:
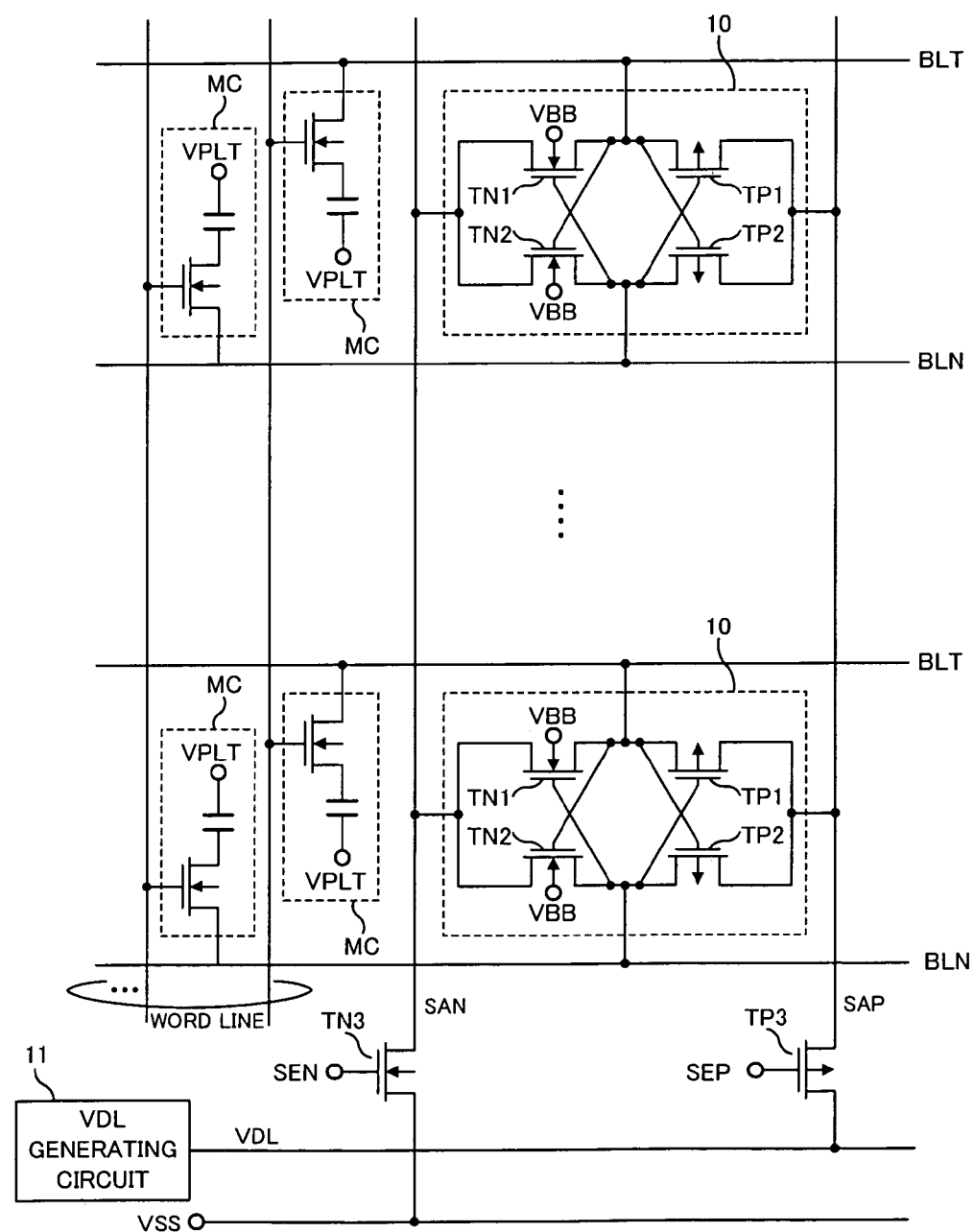
Figure 8:
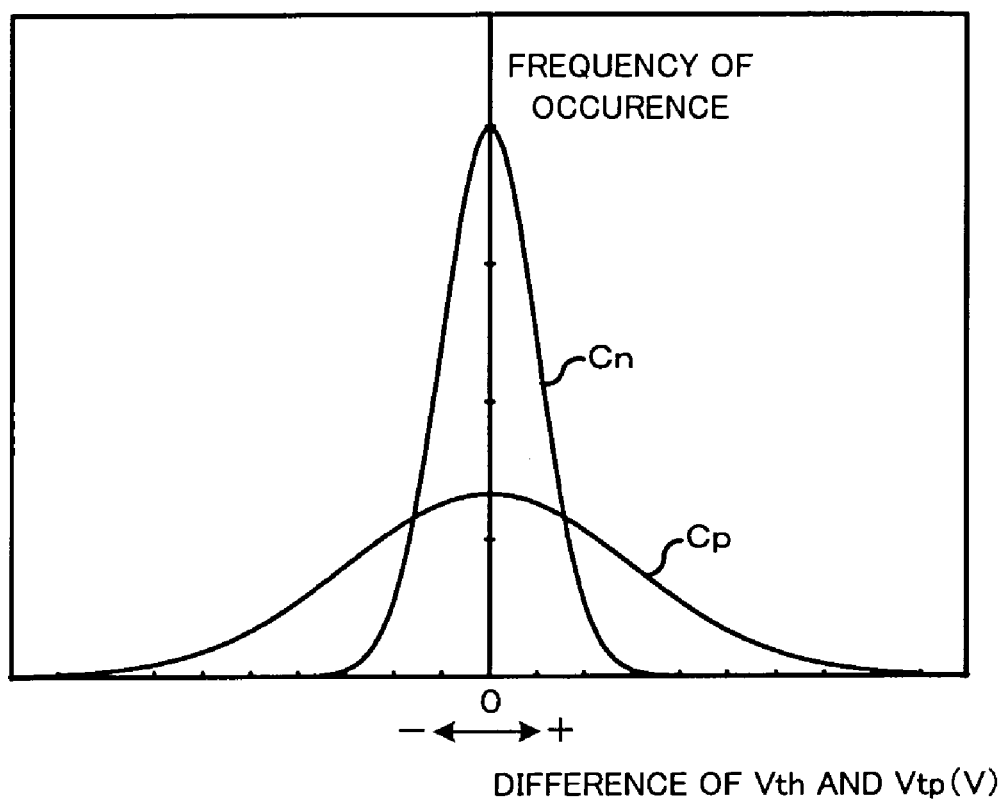
Figure 9:
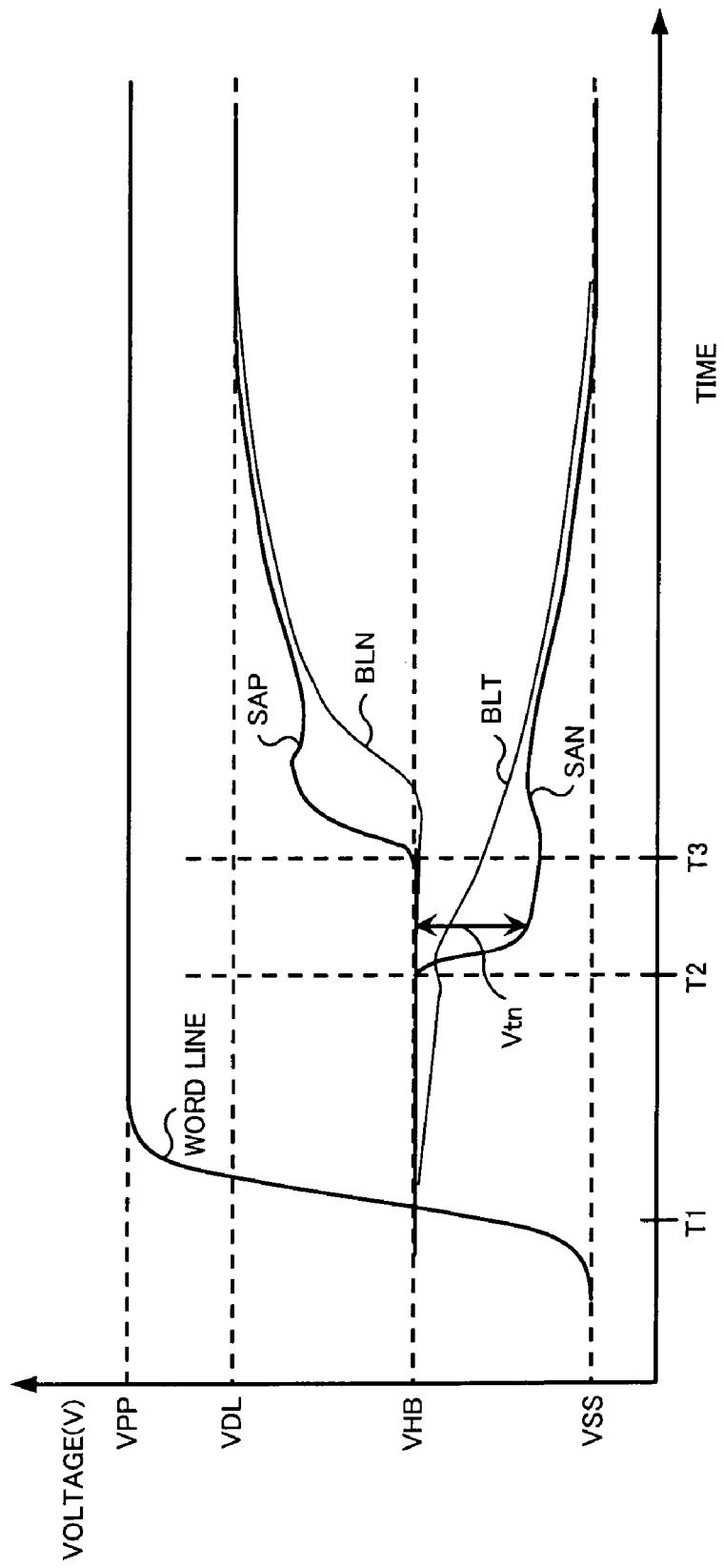
Figure 10:
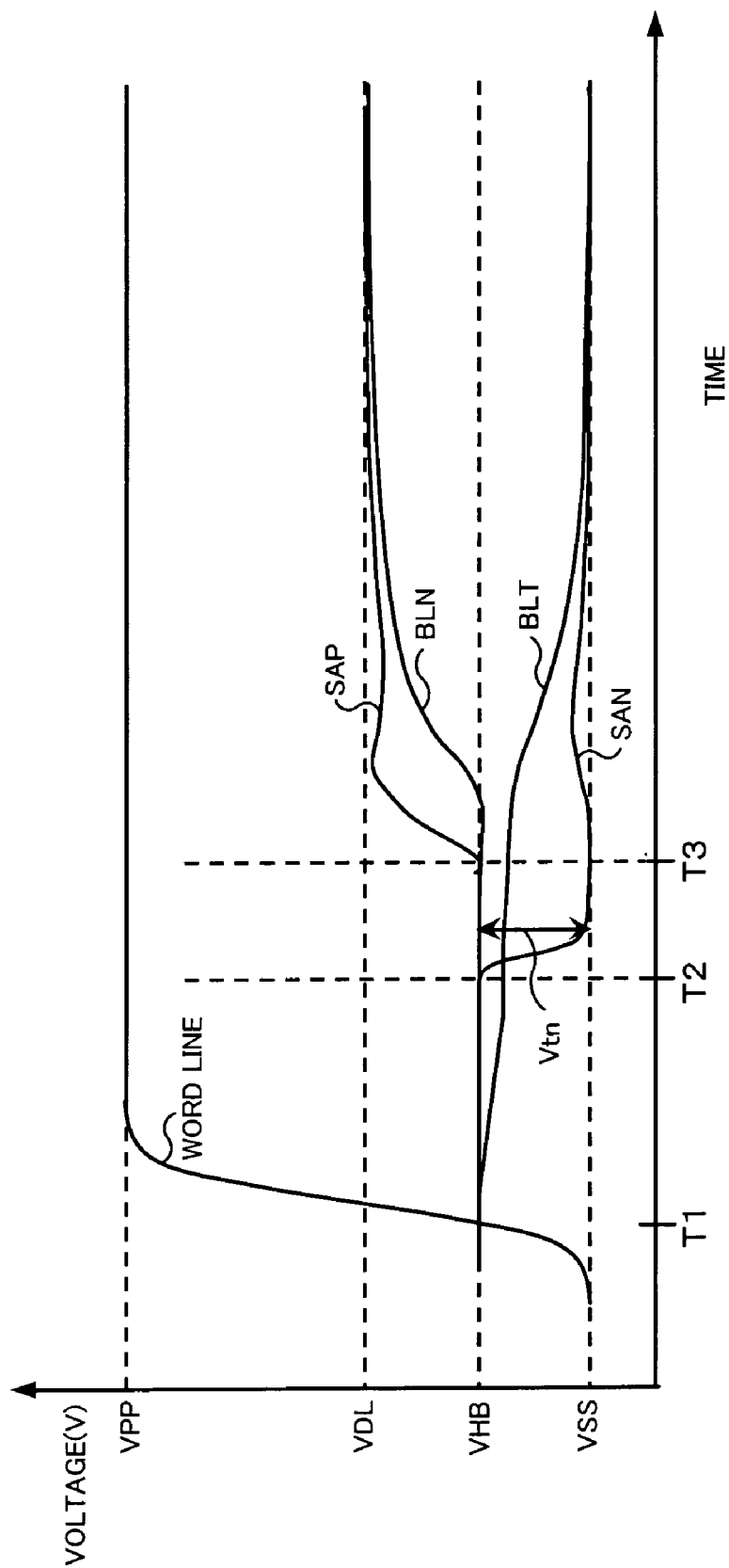

FIG .2 is a diagram showing an example of subthreshold characteristics of NMOS transistor included in a sense amplifier of FIG. 1;

FIG. 3 is a diagram showing a configuration of a first embodiment of a VBB generating circuit;

FIG. 4 is a diagram showing a specific example of a ring oscillator and a charge pump included in the VBB generating circuit of FIG. 3;

FIG. 5 is an operation waveform diagram in a case where an N channel preceding sensing method is employed in the sense amplifier;

FIG. 6 is a diagram showing a configuration of a second embodiment of the VBB generating circuit;

FIG. 7 is a diagram showing a circuit configuration of a primary part of a conventional DRAM;

FIG. 8 is a diagram showing characteristics of fluctuations of threshold voltages Vtn and Vtp in a general DRAM process;

FIG. 9 is a diagram of an example of operation waveforms in a case where the N channel preceding sensing method is employed in the sense amplifier of the conventional DRAM; and FIG. 10 is a diagram of an example of operation waveforms in a case where an array voltage is lowered in comparison with the operation waveform of FIG. 9.

DETAILED DESCRIPTION OF THE INVENTION

An embodiment of the present invention will be described below with reference to accompanying drawings. In this embodiment, the case of applying the invention to DRAM as a semiconductor memory device is described.

FIG. 1 is a diagram showing a primary configuration of DRAM of this embodiment. In FIG. 1, in an entire memory array of the DRAM in which a plurality of bit lines and a plurality of word lines are arranged in a matrix form, a circuit portion in which the same configuration is repeatedly arranged corresponding to a bit line pair BLT/BLN as a complementary pair is shown. In the circuit configuration of FIG. 1, in addition to a memory cell MC, a sense amplifier 10 and a VDL generating circuit 11 which are structural elements nearly common to FIG. 1, a VBB generation circuit 12 is also included.

On each bit line pair BLT/BLN, a sense amplifier 10 composed of a pair of NMOS transistors TN1 and TN2 (first NMOS transistors of the invention) and a pair of PMOS transistors TP1 and TP2 is provided. Each source of the pair of NMOS transistors TN1 and TN2 is connected to a voltage supply line SAN, and each source of the pair of PMOS transistors TP1 and TP2 is connected to a voltage supply line SAP. Each of the NMOS transistor TN1 and the PMOS transistor TP1 has a drain connected to the bit line BLT and a gate connected to the bit line BLN. Each of the NMOS transistor TN2 and the PMOS transistor TP2 has a drain connected to the bit line BLN and a gate connected to the bit line BLT.

An array voltage VDL generated by the VDL generating circuit 11 is connected to the voltage supply line SAP through a PMOS transistor TP3. The voltage supply line SAP is activated by turning the PMOS transistor TP3 on in response to a control signal SEP, and the amplification operation of the PMOS transistors TP1 and TP2 can be performed. The voltage supply line SAN is activated by turning the NMOS transistor TN3 on in response to a control signal SEN, and the amplification operation of the NMOS transistors TN1 and TN2.can be performed.

In addition, a redundancy configuration is generally employed in the memory array. In this case, it is necessary to provide not only normal memory cells MC but also redundancy cells for replacing faulty cells. For example, if read or write operation of the memory cell MC is faulty, a circuit portion corresponding to a bit line pair BLT/BLN to be read or written is replaced with a circuit portion corresponding to a bit line pair provided for a redundancy cell.

In FIG. 1, it is a peculiar structure that aback bias voltage VPP is applied to an N-well in which the pair of NMS transistors TN1 and TN2 of the sense amplifier 10 is formed. The back bias voltage VPP is supplied by the VBB generation circuit 12, and a voltage level of the back bias voltage VPP is properly controlled based on the configuration of the VBB generation circuit 12 so that fluctuations of threshold voltages Vtn of the NMOS transistors TN1 and TN2 are compensated as described later.

Figure 2:
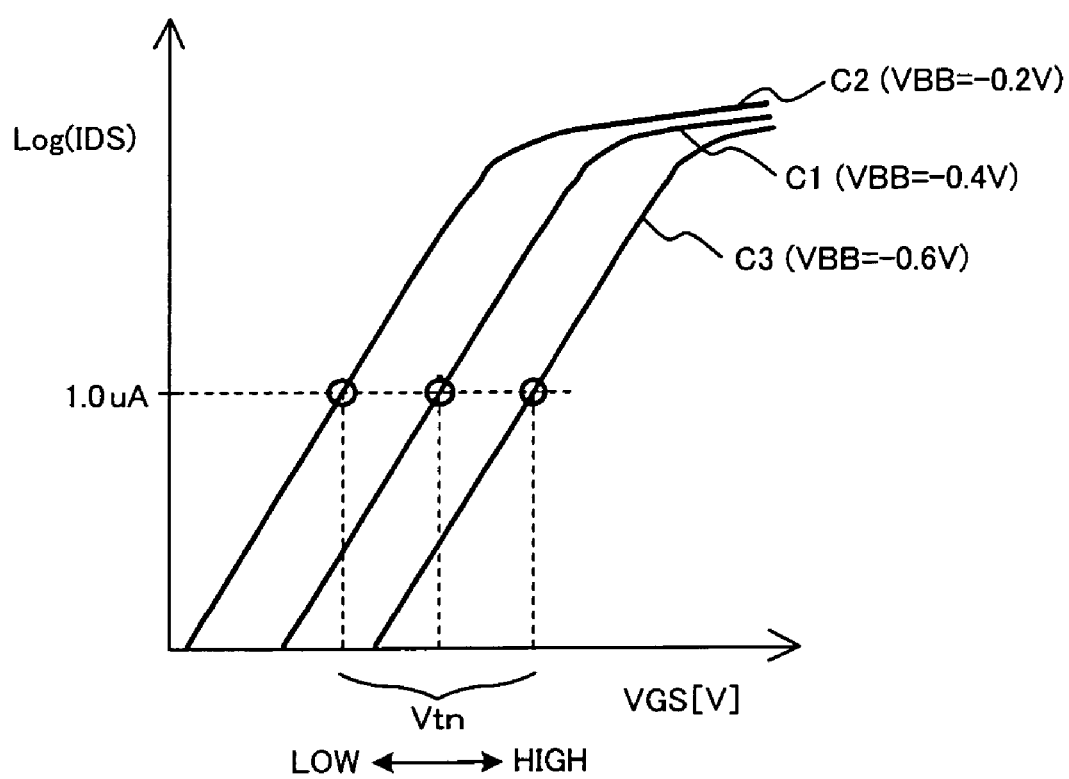

FIG. 2 is a diagram showing an example of subthreshold characteristics of the NMOS transistors TN1 and TN2 included in the sense amplifier 10. In FIG. 2, a graph shows the relationship between the gate-source voltage VGS and the drain current IDS of the NMOS transistors TN1 and TN2. The drain current IDS fluctuates exponentially in a threshold region, and the logarithm of IDS is plotted on the vertical axis and thereby changes linearly. In the example of FIG. 2, the threshold voltage Vtn is defined as a gate-source voltage VGS when IDS is 1.0 µA.

In FIG. 2, three different characteristics C1, C2 and C3 are compared with each other when changing the back bias VBB. Generally, the back bias voltage VBB is set to a negative value slightly less than ground level. Based on the characteristic C1 corresponding to a reference value of the back bias voltage VBB (for example VBB=−0.4 V), the characteristic C2 in which the absolute value of the back bias VBB becomes larger (for example VBB=−0.2 V) and the characteristic C3 in which the absolute value of the back bias voltage VBB becomes smaller (for example VBB=−0.6 V) are shown in comparison. It is understood that the drain current IDS of the NMOS transistors TN1 and TN2 increases in the characteristic C2 and decreases in the characteristic C3 in comparison with the characteristic C1. Therefore, the threshold voltage Vtn corresponding to IDS=1.0 µA becomes smaller in the characteristic C2 (left direction in the Fig) and becomes larger in the characteristic C3 (right direction in the Fig) respectively than the characteristic C1 as a reference.

Accordingly, the VBB generating circuit 12 is required to have characteristics to compensate the fluctuation of the threshold voltage Vtn of the NMOS transistors TN1 and TN2 by utilizing the dependence of the subthreshold characteristics on the voltage VBB shown in FIG. 2. That is, in a case in which the threshold voltage Vtn of the NMOS transistors TN1 and TN2 increases, control may be performed such that the absolute value of the back bias voltage VBB is decreased to lower the threshold voltage Vtn to a desired level. Meanwhile, in a case in which the threshold voltage Vtn of the NMOS transistors TN1 and TN2 decreases, control may be performed such that the absolute value of the back bias voltage VBB is increased to increase the threshold voltage Vtn to a desired level.

Next, specific configuration and operation of the VBB generating circuit 12 of FIG. 1 will be described. A number of embodiments can be applied to the VBB generating circuit 12. A first embodiment of the VBB generating circuit 12 will be described first based on a configuration of FIG. 3. As shown in FIG. 3, the VBB generating circuit 12 of the first embodiment is composed of a level detection circuit 20 which detects the level of the back bias voltage VBB being fed back, a ring oscillator 21 which is an oscillation circuit including multistage inverters connected in a ring shape, and a charge pump 22 which generates the back bias voltage VBB by charge pumping operation based on an oscillating output of the ring oscillator 21.

In the above-mentioned configuration, the level detection circuit 20 is composed of a series circuit where a resistor R1, an NMOS transistor TN10 (second NMOS transistor of the invention) and a resistor R2 are connected, and a comparator 30. Two reference voltages VRFEF1 and VREF2 generated by voltage sources (not shown) are applied to the level detection circuit 20. In the series circuit of the level detection circuit 20, the resistor R1 and the drain and gate of the NMOS transistor TN10 are connected at node N2, and the source of the NMOS transistor TN10 and the resistor R2 are connected at node N1. Further, at one end of the series circuit, the resistor R1 is connected to a reference voltage VREF1, and at the other end of the series circuit, the resistor R2 is connected to an output side of the charge pump 22.

In addition, the reference voltage VREF1 is set at higher level than the back bias voltage VBB, and the reference voltage VREF2 is set at higher level than the back bias voltage and at lower level than the reference voltage VREF1. For example, settings of VREF1=1.6 V and VREF2=0.7 V can be used.

The comparator 30 is connected to node N1 at its positive input terminal and the reference voltage VRE2 is applied to its negative input terminal. In the level detection circuit 20, a level of a signal ENABLE which is a detected output of the comparator 30 changes depending on the relationship in levels between the positive and negative input terminals of the comparator 30. That is, if the voltage level at node N1 increases and becomes higher than the reference voltage VREF2, the signal ENABLE becomes high. Meanwhile, if the voltage level at node N1 decreases and becomes lower than the reference voltage VREF2, the signal ENABLE becomes low.

Thereby, when the signal ENABLE is high, the ring oscillator 21 and the charge pump 22 are activated to change the back bias voltage VBB downward. Meanwhile, when the signal ENABLE is low, the ring oscillator 21 and the charge pump 22 are non-activated to halt operation, and the back bias voltage VBB is changed upward by the current from the level detection circuit 20.

In the configuration of FIG. 3, the voltage of node N1 is denoted by V(N1), the gate-source voltage of the NMOS transistor TN10 is denoted by VGS, and the current flowing through the resistor R1 is denoted by I and is expressed as follows:

$$I \cdot R1 + VGS = VREF1 - V(N1) \tag{1}$$

This current I is equal to the drain current IDS flowing through the NMOS transistor TN10. Then, feedback is performed so that levels at the positive and negative input terminals of the comparator 30 are the same, and the voltage V(N1) is controlled to have the same level as that of the reference voltage VREF2. Thus, the equation (1) is expressed as follows:

$$I \cdot R1 + VGS = VREF1 - VREF2 \tag{2}$$

Thus, by using the equation (2), the current I is expressed as follows:

$$I = (VREF1 - VREF2 - VGS)/R1 \tag{3}$$

Meanwhile, since the current I also flows through the resistor R2, the following equation is satisfied:

$$I \cdot R2 = VREF2 - VBB \tag{4}$$

Thus, by using the equations (3) and (4), the following equation is satisfied:

$$VBB = R2 \cdot (VREF2 - VREF1 + VGS)/R1 + VREF2 \tag{5}$$

The gate-source voltage VGS in the case of IDS=1 µA is defined as the threshold voltage Vtn of the NMOS transistor TN10. In this case, the gate-source voltage VGS in the equation (5) is replaced with the threshold voltage Vtn and the following equation is satisfied.

$$VBB = R2 \cdot (VREF2 - VREF1 + Vtn)/R1 + VREF2 \tag{6}$$

In the equation (6), while attention is paid to the voltage change ΔVBB of the back bias voltage VBB and the voltage change ΔVtn of the threshold voltage Vtn, a following relationship is satisfied.

$$\Delta VBB = (R2/R1) \cdot \Delta Vtn \tag{7}$$

Thus, since ΔVtn and ΔVBB change in proportion to each other by a proportional coefficient R2/R1, a preferable relationship between ΔVtn and ΔVBB can be set by selecting the resistors R1 and R2 appropriately. Here, it is assumed that an operation point at which the back bias voltage VBB has a negative value is set, the absolute value of the back bias voltage VBB decreases as the threshold voltage Vtn increases, and the absolute value of the back bias voltage VBB increases as the threshold voltage Vtn decreases.

In FIG. 3, it is necessary to form the NMOS transistor TN10 having the same operating characteristics as the NMOS transistors TN1 and TN2 included in the sense amplifier 10. If their operating characteristics are different, the back bias voltage VBB is not properly controlled by the feedback control of the VBB generating circuit 12. Therefore, the NMOS transistor TN10 is required to be formed with the same manufacturing process and to have the same shape as the NMOS transistors TN1 and TN2.

Next, FIG. 4 is a diagram showing a specific example of the ring oscillator 21 and the charge pump 22 included in the VBB generation circuit 12 of FIG. 3. The ring oscillator 21 as shown in FIG. 4 includes a single NAND circuit 201 and multistage inverters 202 connected in a ring shape. In the NAND circuit 201, the above-mentioned signal ENABLE is input to one terminal and an oscillating output of the ring oscillator 21 is fed back to the other input terminal. If the inverters 202 are connected in an even number of stages, an entire connection including the NAND circuit 201 is an odd number of stages, and self-oscillation with a predetermined frequency occurs in the ring oscillator 21. The self-oscillation in the ring oscillator 21 is enabled only when the signal EABLE is high.

The charge pump 22 shown in FIG. 4 is composed of an inverter 203, a capacitor 204, and two NMOS transistors 205 and 206. An oscillating output of the ring oscillator 21 is input to the inverter 203 of the charge pump 203, and the capacitor 204 is charged and discharged by the NMOS transistors 205 and 206. The pumping operation is performed so that the NMOS transistors 205 and 206 alternately turns ON and OFF repeatedly in response to the level of the oscillating output, and operation is performed so that the level of the back bias voltage VBB decreases gradually.

Next, sensing operation of the DRAM of this embodiment will be described. FIG. 5 shows an operation waveform diagram in the case where the N channel preceding sensing method is employed in the sense amplifier 10. In the operation waveforms shown in FIG. 5, operation is controlled by the same procedure as in FIG. 10 using a low array voltage VDL. An operation in which a selected word line rises from the voltage VPP to the voltage VPP at timing T1 after the sensing operation is started is the same as in FIG. 10. Meanwhile, the voltage supply line SAN maintained at the pre-charge voltage VHB level is activated and decreases at timing T2, and clamped at a voltage level lower by the threshold voltage Vtn. In this case, comparing FIG. 5 with FIG. 10, the threshold voltage Vtn is lower than VHB-VSS and thereby is not limited by the ground potential VSS. This is because the back bias voltage VBB decreases by a certain level by the proper control of the VBB generating circuit 12, and as a result the threshold voltages Vtn of the NMOS transistors TN1 and TN2 decrease.

As described above, the voltage level of the bit line BLT decreases gradually by the operation of the NMOS transistors TN1 and TN2, and it is possible to increase the voltage difference of the bit line pair BLT/BLN. When the voltage supply line SAP is activated at timing T3, the voltage difference of sufficient magnitude can be obtained, which is not affected by the Vtn unbalance. If the voltage supply line SAP is activated, its voltage level rises from the pre-charge voltage VHB to the array voltage VDL. As time elapses, the voltage level of one bit line BLN converges to the array voltage VDL gradually and the voltage level of the other bit line BLT converges to the ground potential VSS gradually.

In this embodiment, particularly in a case where a memory array is configured with the lower array voltage VDL, it is useful to control the threshold voltage Vtn to a lower level so that the voltage supply line SAN is maintained at a proper voltage level within a time range between timings T2 and T3 as shown in FIG. 5.

Next, a second embodiment of the VBB generating circuit 12 will be described based on FIG. 6. As shown in FIG. 6, the VBB generating circuit 12 of the second embodiment has basic structural elements being the same as those of the first embodiment, and descriptions thereof are omitted. Meanwhile, in the second embodiment, in comparison with the series circuit of the level detection circuit 20 of the first embodiment, the fixed resistor R1 is replaced with a variable resistor R3 and the fixed resistor R2 is replaced with a variable resistor R4. These variable resistors R3 and R4 can be formed, for example, by a plurality of fixed resistors having desired resistance values to which switching elements being turned ON and OFF by a test mode or fuses are parallel connected.

The configuration of the second embodiment is useful when adjusting a relationship between the back bias voltage VBB and the threshold voltage Vtn of the VBB generation circuit 12 in DRAM manufacturing. That is, in the second embodiment, the equation (6) shown in the first embodiment is expressed as follows:

$$VBB = R4 \cdot (VREF2 - VREF1 + Vtn)/R3 + VREF2 \qquad (8)$$

And the equation (7) of the first embodiment is expressed as follows:

$$\Delta VBB = (R4/R3) \cdot \Delta Vtn \qquad (9)$$

Thus, desired characteristics can be obtained by appropriately adjusting the values of the variable resistors R3 and R4 included in the equations (8) and (9). For example, if fluctuations of the threshold voltage Vtn due to manufacturing process are adjusted beforehand by the variable resistors R3 and R4, it is possible to control so as to cancel the change of the threshold voltage Vtn caused by temperature fluctuations or the like.

In the foregoing, the present invention is specifically described based on the embodiments, but the invention is not limited to the above-mentioned embodiments, and is capable of being carried into practice without departing from the scope of the subject matter. For example, the invention is widely applicable to DRAMs having various configurations as well as the DRAM having the configuration of FIG. 1. Further, the invention is widely applicable to semiconductor memory devices as well as DRAM as a semiconductor memory device.

The present invention is not limited to the above described embodiments, and various variations and modifications may be possible without departing from the scope of the present invention.

This application is based on the Japanese Patent application No. 2005-259910 filed on Sep. 7, 2005, entire content of which is expressly incorporated by reference herein.

What is claimed is:

1. A semiconductor memory device comprising:
 a sense amplifier which includes a pair of first NMOS transistors and a pair of PMOS transistors connected to a bit line pair as a complementary pair and amplifies a potential difference of a memory cell formed on said bit line pair;

a back bias generating circuit which generates a back bias voltage to be applied to said first NMOS transistors in a state in which a predetermined current is flowing through a second NMOS transistor having approximately the same operating characteristic as that of said first NMOS transistors, and performs a feedback control in response to a threshold voltage of said second NMOS transistor so as to decrease an absolute value of said back bias voltage as said threshold voltage increases and to increase said absolute value of said back bias voltage as said threshold voltage decreases; and control means which performs control in a sensing operation of said sense amplifier such that said pair of first NMOS transistors operates previously and after a lapse of a predetermined time said pair of first PMOS transistors operates.

2. A semiconductor memory device according to claim 1, wherein said back bias voltage generating circuit includes a series circuit including a first resistor connected to a drain and a gate of said second NMOS transistor and a second resistor connected to a source of said second NMOS transistor and includes a level detection circuit for detecting a voltage level of said source of said second NMOS transistor through which a predetermined current flows, and wherein a voltage level of said back bias voltage is controlled in response to a detected output of said level detection circuit.

3. A semiconductor memory device according to claim 2, wherein at one end of said series circuit, said first resistor is connected to a first reference voltage higher than said back bias voltage, and at an other end of said series circuit, said second resistor is connected to said back bias voltage, and wherein said level detection circuit includes a comparator having one input terminal connected to the source of said second NMOS transistor and an other input terminal connected to a second reference voltage higher than said back bias voltage and lower than said first reference voltage.

4. A semiconductor memory device according to claim 2, wherein said back bias generating circuit performs said feedback control so that using a voltage change ΔVtn of said threshold voltage Vtn, a resistance value R1 of said first resistor and a resistance value R2 of said second resistor, a relationship of $$\Delta VBB = (R2/R1) \cdot \Delta Vtn$$

is satisfied.

5. A semiconductor memory device according to claim 2, wherein said first resistor and said second resistor are variable resistors.

6. A semiconductor memory device according to claims 1 to 5, wherein said back bias generating circuit comprises a ring oscillator in which oscillating operation thereof is controlled in response to a detected output of said level detection circuit and a charge pump for generating said gate voltage by charge pumping operation based on an oscillating output of said ring oscillator.

* * * * *